United States Patent
Choi et al.

(10) Patent No.: US 10,923,311 B1
(45) Date of Patent: Feb. 16, 2021

(54) CATHODE FOR ION SOURCE COMPRISING A TAPERED SIDEWALL

(71) Applicant: XIA TAI XIN SEMICONDUCTOR (QING DAO) LTD., Qingdao (CN)

(72) Inventors: Keewoung Choi, Singapore (SG); Jong-Moo Choi, Singapore (SG); Heung-Woo Park, Singapore (SG); Hasung Lee, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,342

(22) Filed: Nov. 11, 2019

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/082* (2013.01)

(58) Field of Classification Search
CPC ... H01J 37/08; H01J 37/3171; H01J 2237/082
See application file for complete search history.

(56) References Cited

U.S. PATENT DOCUMENTS

| | | | |
|---|---|---|---|
| 6,217,716 B1* | 4/2001 | Fai Lai | C23C 14/35 204/192.12 |
| 7,718,978 B2* | 5/2010 | Yamashita | H01J 37/08 250/423 R |
| 10,269,530 B1* | 4/2019 | Hsu | H01J 27/02 |
| 2004/0066128 A1* | 4/2004 | Suguro | H01J 37/08 313/361.1 |
| 2010/0101947 A1* | 4/2010 | Nishimura | H01J 37/345 204/298.16 |
| 2013/0249400 A1* | 9/2013 | Sato | H01J 27/024 315/111.81 |
| 2016/0351379 A1* | 12/2016 | Sato | H01J 37/3244 |
| 2019/0066967 A1* | 2/2019 | Kao | H01J 37/3171 |

* cited by examiner

*Primary Examiner* — Borna Alaeddini
(74) *Attorney, Agent, or Firm* — ScienBiziP, P.C.

(57) ABSTRACT

An apparatus for ion implantation is disclosed. The apparatus comprising an arc chamber and an electron source device. The electron source device includes a cathode and a filament. The filament is disposed within the cathode. The cathode has a body and a cap disposed over the body. The cap has a receiving surface and a emitting surface opposite the receiving surface. The emitting surface has a convex shape facing the receiving area of the arc chamber and the receiving surface has a conical shape where a center area is a flat surface and the center area being surrounded by a tapered sidewall.

20 Claims, 3 Drawing Sheets

US 10,923,311 B1

CATHODE FOR ION SOURCE COMPRISING A TAPERED SIDEWALL

BACKGROUND OF THE INVENTION

1. Field of the Invention

The present disclosure generally relates to a cathode, and more particularly, a structure of a cathode for ion implantation.

2. Related Art

For semiconductor fabrication, an ion source is a critical component of an ion implanter. Ion implanters commonly include ion sources with cathodes exposed to highly corrosive plasma in an arc chamber. Such cathodes typically degrade in the corrosive environment of the arc chamber. Enhancing the operational duration of a cathode member of an iron implanter may improve efficiency of semiconductor fabrication.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
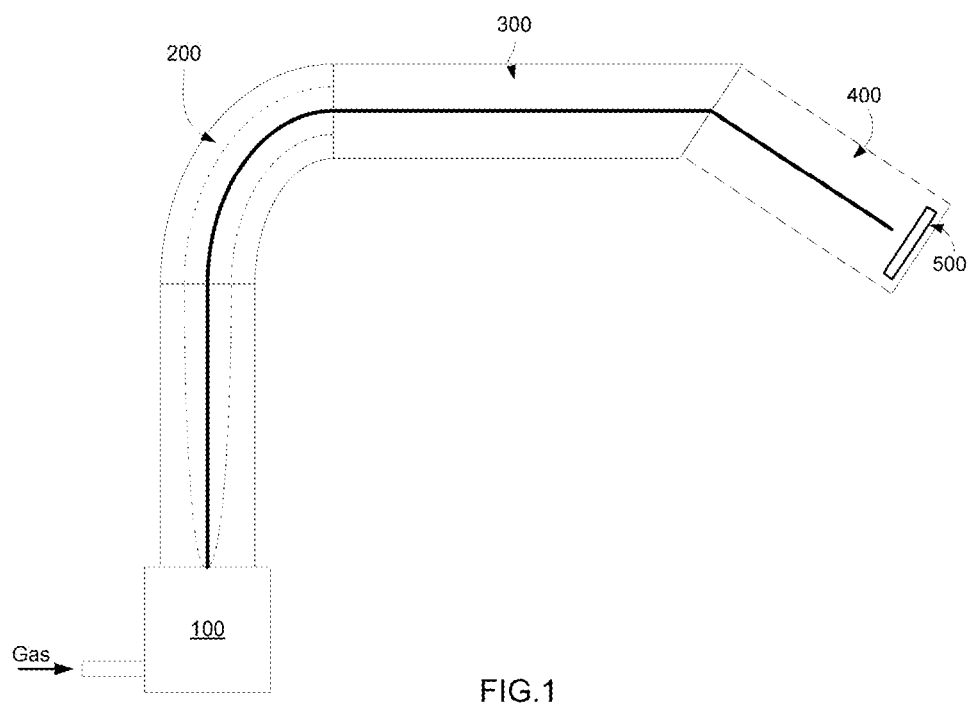
FIG. 1 illustrates an ion implanter according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates an ion implanter according to some embodiments of the instant disclosure. The ion implanter may include an ion source 100, an ion analyzer 200, an accelerator 300, and a doping chamber 400. The ion source 100 is configured to generate a mixture of ions. The ion analyzer 200 is coupled to the ion source 100. The mixture of ions includes ions required by the ion implantation process. The ion analyzer 200 is configured to analyze the mixture of ions generated by the ion source 100 and select the ions required by the process from the mixture of ions. The accelerator 300 is coupled to the ion analyzer 200. The accelerator 300 is configured to accelerate the speed of the selected ions to ensure penetration of into the substrate 500. The doping chamber 400 is coupled to the accelerator and is configured to hold the substrate 500. As shown in FIG. 1, the direction of the selected ions is changed to further ensure that only the selected ions are fed into the doping chamber 400 and implanted into the substrate 500.

Figure 2:
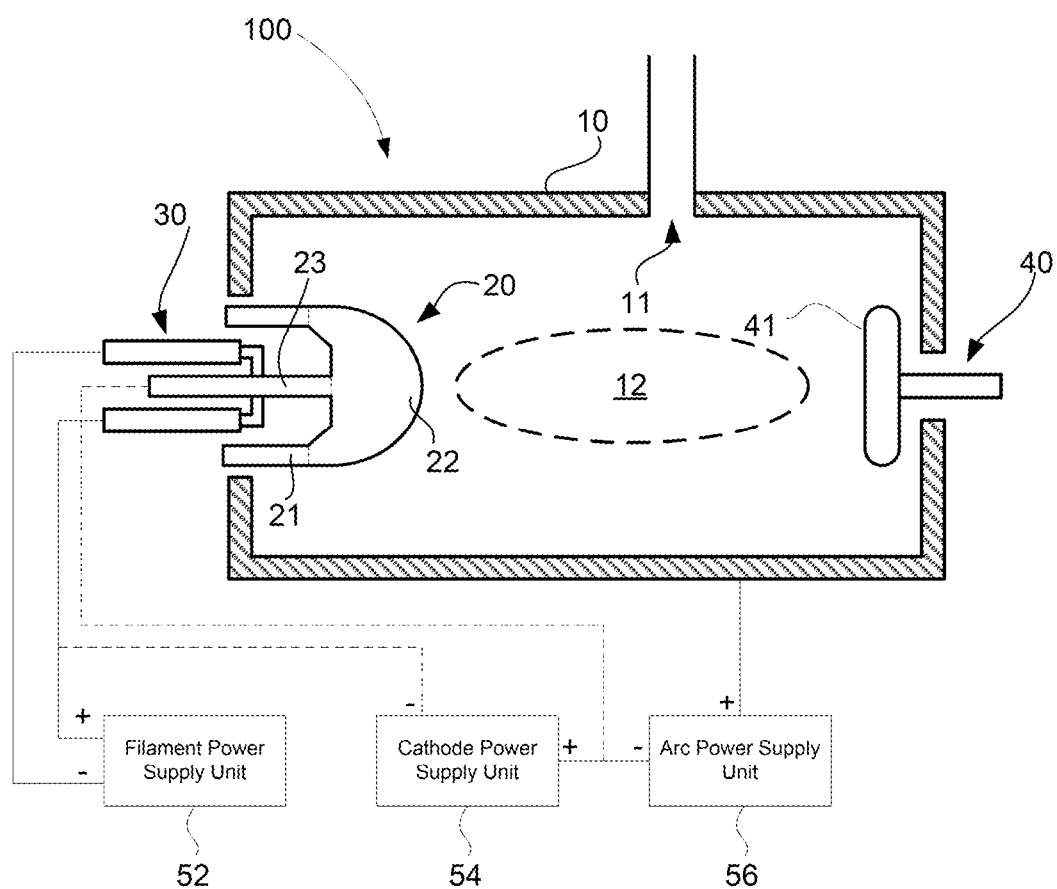
FIG. 2 illustrates an apparatus for ion source according to some embodiments of the instant disclosure.

FIG. 2 illustrates an apparatus for an ion source according to some embodiments of the instant disclosure. The apparatus includes an arc chamber 10 and an electron source device. The arc chamber 10 has a hollow interior that defines a receiving area 12. In the illustrated embodiment, the arc chamber 10 further includes an inlet 11 to deliver the chemical to the receiving area 12 of the arc chamber 10. A plasma that includes ions of a chemical may be generated in the receiving area 12 during operation of the apparatus. The electron source device may be protruding into the receiving area 12 of the arc chamber 10. The electron source device includes a cathode 20 and a filament 30. In some embodiments, the cathode 20 has a substantially conical body that defines a cavity that faces away from the interior of the arc chamber 10. The filament 30 is disposed at least partially in the cavity of the cathode 20. In some embodiments, the filament 30 is formed to have a spiral shape. During operation, the filament 30 may be heated using a filament power supply unit 52 to generate thermal electrons. The thermal electrons generated by the filament 30 may then be accelerated by an electric field generated using a cathode power supply unit 54. The cathode 20 collides with the thermal electrons and is heated through the energy produced during the collision to generate secondary thermal electrons. The secondary thermal electrons are accelerated using a voltage from an arc power supply unit 56 that is coupled between the cathode 20 and the arc chamber 10. In some embodiments, the secondary thermal electrons are the electrons used to ionize chemical to form plasma. In some embodiments, the apparatus further includes a repeller 40 that has a repeller plate 41 disposed in a wall of the arc chamber facing the cathode 20. The repeller plate 41 may repel electrons within the arc chamber 10 to keep the electrons within the receiving area 12.

Figure 3:
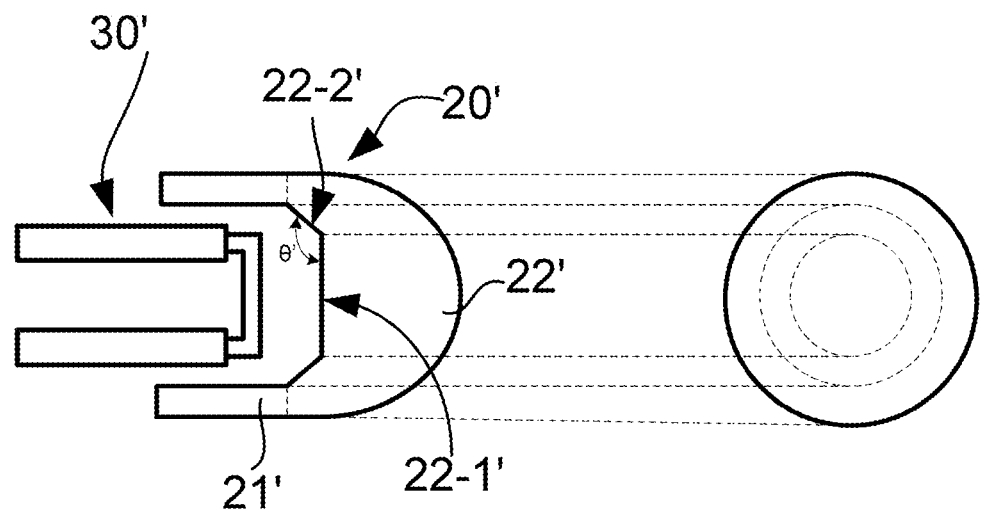
FIG. 3 illustrates a cathode according to some embodiments of instant disclosure.

FIG. 3 illustrates a lateral sectional view of a cathode according to some embodiments of instant disclosure. The cathode 20' includes a body 21' and a cap 22' disposed over the body 21'. In some embodiments, the body 21' is a hollow cylinder and the filament 30' is disposed in the cavity of the body 21'. The cap 22' includes a receiving surface and a emitting surface opposite the receiving surface. The diameter of the cap 22' may range from about 21 mm to 22 mm. In an exemplary embodiment, the diameter of the cap 22' is about 21.7 mm. The emitting surface has a convex shape facing the receiving area 12 of the arc chamber 10 as shown in FIG. 1. The receiving surface has a conical shape where a center area is a flat surface 22-1' and the center area is surrounded by a tapered sidewall 22-2'. The tapered sidewall 22-2' is at an angle θ' from the flat surface 22-1'. The angle θ' ranges from about 130° C. to 140° C. The design of a tapered sidewall 22-2' may increase an effective thickness at the edge of the cathode 20' exposed to the corrosive material and thereby increase the lifetime of the cathode 20'. In some embodiments, the diameter of the center area ranges from about 6 mm to 7 mm. The material used to form the cathode 20' may be a high melting point material. In some embodiments, the cathode 20' is made of material including tungsten (W). A distance between the tapered sidewall of the receiving surface to the emitting surface is substantially equal to a distance between the flat surface 22-1' of the receiving surface to the emitting surface. A diameter of the body 21' is two to four times a diameter of the flat surface 22-1' of the receiving surface. The body 21' is a cylinder having a wall with a thickness ranging from about 1 mm to 1.5 mm. In some embodiments, a frontal profile of the cathode member (e.g., a frontal sectional view of the cap 22' and/or the body 21') resembles a circle. In some embodiments, however, the frontal profile of the cathode member may resemble a regular polygonal shape that defines a geometric center.

Figure 4:
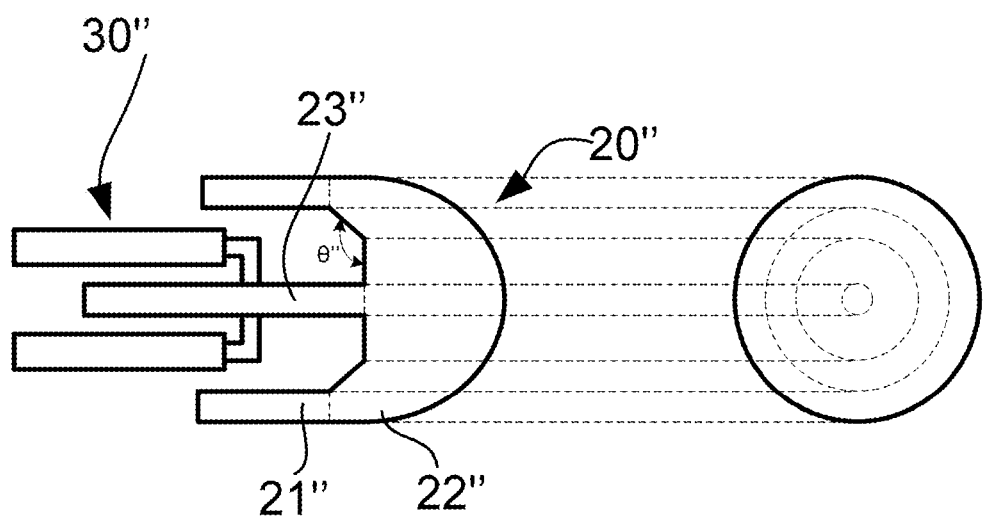
FIG. 4 illustrates a cathode according to some other embodiments of instant disclosure.

FIG. 4 illustrates a cathode according to some other embodiments of instant disclosure. The cathode 20" includes a body 21" and a cap 22" disposed over the body 21". The cap 22" includes a receiving surface and an emitting surface opposite the receiving surface. The diameter of the cap 22" may range from about 21 mm to 22 mm. In an exemplary embodiment, the diameter of the cap 22" is about 21.7 mm. The emitting surface has a convex shape facing the receiving area 12 of the arc chamber 10 as shown in FIG. 1. The receiving surface has a conical shape where a center area is a flat surface 22-1" and the center area is surrounded by a tapered sidewall 22-2". The tapered sidewall 22-2' is at an angle θ" from the flat surface 22-1'. The angle θ" ranges from about 130° to 140°. In some embodiments, the diameter of the center area ranges from about 6 mm to 7 mm. In some embodiments, the cathode 20" is made of material including tungsten. A distance between the tapered sidewall of the receiving surface to the emitting surface is substantially equal to a distance between the flat surface 22-1" of the receiving surface to the emitting surface. a diameter of the body 21" is two to four times a diameter of the flat surface 22-1" of the receiving surface. The body 21" is a cylinder having a wall with a thickness ranging from about 1 mm to 1.5 mm. In some embodiments, the cathode 20" further includes a support rod 23" disposed in a center of the body 21". The support rod 23" coupled to the cap may be cylindrical in shape. A diameter of the support rod 23" ranges from about 1.8 mm to 2.2 mm. A cathode power supply unit 54 shown in FIG. 1 may be coupled to the cathode 20" through the support rod 23". The filament 30" may be formed to have an opening big enough to accommodate the support rod 23". In other words, the filament 30" may be wound around the support rod 23".

Figure 5:
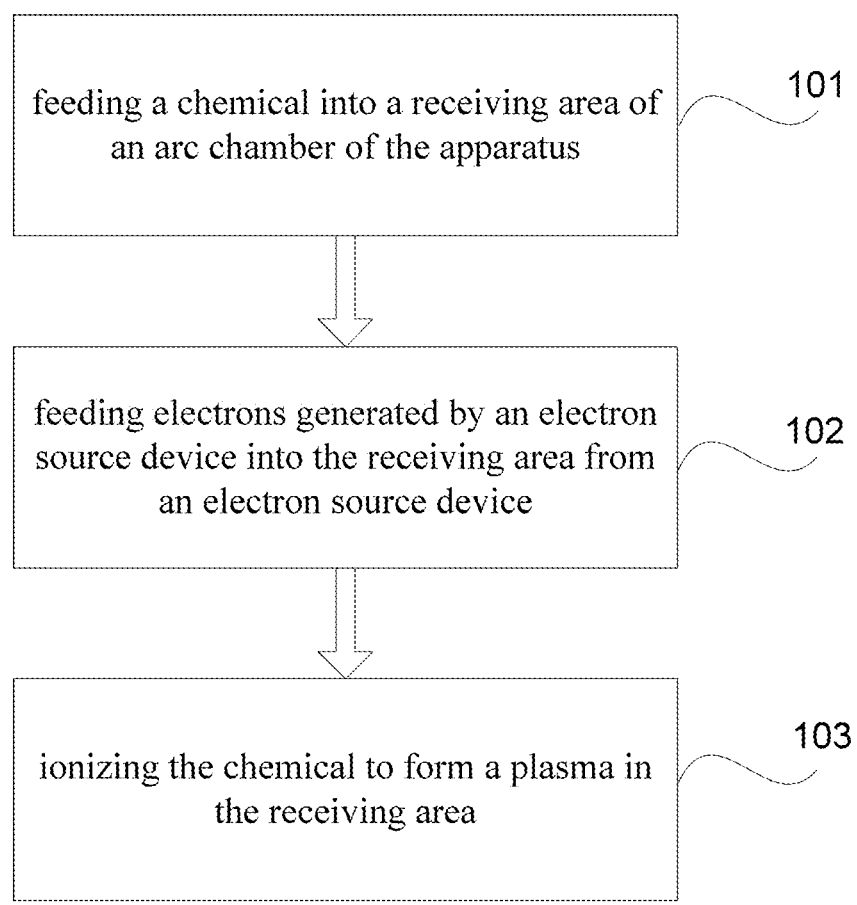
FIG. 5 illustrates a flowchart of a method of generating ions using an apparatus according to some embodiments of instant disclosure.

FIG. 5 illustrates a flowchart of a method of generating ions using an apparatus according to some embodiments of instant disclosure. The method of generating ions using an apparatus for ion source includes feeding a chemical into a receiving area of an arc chamber of the apparatus (101), feeding electrons generated by an electron source device into the receiving area from an electron source device (102), and ionizing the chemical to form a plasma in the receiving area (103).

As shown in FIG. 2, the electron source device used to generate the electrons comprises a cathode 20 has a body 21 and a cap 22 disposed over the body 21. The cap 22 has a receiving surface and a emitting surface opposite the receiving surface. The emitting surface has a convex shape facing the receiving area 12 of the arc chamber 10. The receiving surface has a conical shape where a center area is a flat surface and the center area being surrounded by a tapered sidewall. A filament is disposed within the body of the cathode 20. The filament 30 may be heated using a filament power supply unit 52 to generate thermal electrons. The thermal electrons generated by the filament 30 may then be accelerated by an electric field generated using a cathode power supply unit 54. The cathode 20 collides with the thermal electrons and is heated through the energy produced during the collision to generate secondary thermal electrons. The secondary thermal electrons are emitted into the receiving area 12. The secondary thermal electrons are accelerated using a voltage from an arc power supply unit 56 that is coupled between the cathode 20 and the arc chamber 10. In some embodiments, the secondary thermal electrons are the electrons used to form plasma. The chemical is fed into the receiving area 12 through an inlet. The chemical and the electrons interact with each other to generate ions that form the plasma. In some embodiments, a repeller plate 41 disposed in a wall of the arc chamber facing the cathode 20 may repel electrons within the arc chamber 10 to keep the electrons within the receiving area 12.

In some embodiments, a diameter of the body 21 of the cathode 20 is two to four times a diameter of the flat surface of the receiving surface. The cathode 20 is made of material including tungsten. A distance between the tapered sidewall of the receiving surface to the emitting surface is substantially equal to a distance between the flat surface of the receiving surface to the emitting surface.

In some embodiments, the cathode 20 further comprises a support rod 23 disposed in a center of the body. A diameter of the support rod 23 ranges from about 1.8 mm to 2.2 mm. The support rod 23 coupled to the cap 22 is cylindrical in shape. The support rod 23 of the cathode is configured to receive a voltage from a cathode power supply unit 54 to generate an electric field to induce collision between the thermal electrons from the filament 30 and the receiving surface of the cathode 20. The secondary thermal electrons are then emitted from the emitting surface of the cathode 20.

Accordingly, one aspect of the instant disclosure provides an apparatus. The apparatus comprises an arc chamber having a receiving area in which a plasma comprising ions of a chemical is generated during operation; and an electron source device protruding into the receiving area of the arc chamber. The electron source device comprises a cathode having a body and a cap disposed over the body, the cap having a receiving surface and a emitting surface opposite the receiving surface, the emitting surface having a convex shape facing the receiving area of the arc chamber, the receiving surface having a conical shape where a center area is a flat surface and the center area being surrounded by a tapered sidewall; and a filament disposed in the body of the cathode.

In some embodiments, the cathode is made of material including tungsten.

In some embodiments, a distance between the tapered sidewall of the receiving surface to the emitting surface is substantially equal to a distance between the flat surface of the receiving surface to the emitting surface.

In some embodiments, a diameter of the body is two to four times a diameter of the flat surface of the receiving surface.

In some embodiments, the body is a cylinder having a wall with a thickness ranging from about 1 mm to 1.5 mm.

In some embodiments, the cathode further comprises a support rod disposed in a center of the body.

In some embodiments, a diameter of the support rod ranges from about 1.8 mm to 2.2 mm.

In some embodiments, the support rod coupled to the cap is cylindrical in shape.

In some embodiments, the filament is wound around the support rod.

In some embodiments, further comprises a repeller plate disposed in a wall of the arc chamber facing the cathode.

In some embodiments, the filament is formed to have a spiral shape.

In some embodiments, the tapered sidewall is at an angle to the flat surface and the angle ranges from about 130° to 140°.

Accordingly, another aspect of the instant disclosure provides a method of generating ions using an apparatus. The method comprises feeding a chemical into a receiving area of an arc chamber of the apparatus; feeding electrons generated by an electron source device into the receiving area from an electron source device, the electron source device comprises a cathode having a body and a cap disposed over the body, the cap having a receiving surface and a emitting surface opposite the receiving surface, the emitting surface having a convex shape facing the receiving area of the arc chamber, the receiving surface having a conical shape where a center area is a flat surface and the center area being surrounded by a tapered sidewall; and a filament disposed in the body of the cathode; and ionizing the chemical to form a plasma comprising ions of the chemical in the receiving area.

In some embodiments, a diameter of the body is two to four times a diameter of the flat surface of the receiving surface.

In some embodiments, the cathode is made of material including tungsten.

In some embodiments, a distance between the tapered sidewall of the receiving surface to the emitting surface is substantially equal to a distance between the flat surface of the receiving surface to the emitting surface.

In some embodiments, the cathode further comprises a support rod disposed in a center of the body.

In some embodiments, the support rod of the cathode is configured to receive a voltage from a cathode power supply unit to generate an electric field.

In some embodiments, the support rod coupled to the cap is cylindrical in shape and a diameter of the support rod ranges from about 1.8 mm to 2.2 mm.

In some embodiments, the tapered sidewall is at an angle to the flat surface and the angle ranges from about 130° C. to 140° C.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus, comprising:
   an arc chamber having a receiving area in which a plasma comprising ions of a chemical is generated during operation; and
   an electron source device protruding into the receiving area of the arc chamber, the electron source device comprising:
      a cathode having a body and a cap disposed over the body, the cap having a receiving surface and an emitting surface opposite the receiving surface, the emitting surface having a convex shape facing the receiving area of the arc chamber, the receiving surface having a truncated conical shape where a center area is a flat surface and the center area being surrounded by a tapered sidewall; and
      a filament disposed in the body of the cathode.

2. The apparatus of claim 1, wherein the cathode is made of material including tungsten.

3. The apparatus of claim 1, wherein a distance between the tapered sidewall of the receiving surface to the emitting surface is substantially equal to a distance between the flat surface of the receiving surface to the emitting surface.

4. The apparatus of claim 1, wherein a diameter of the body is two to four times a diameter of the flat surface of the receiving surface.

5. The apparatus of claim 1, wherein the body is a cylinder having a wall with a thickness ranging from about 1 mm to 1.5 mm.

6. The apparatus of claim 1, wherein the cathode further comprises a support rod disposed in a center of the body.

7. The apparatus of claim 6, wherein a diameter of the support rod ranges from about 1.8 mm to 2.2 mm.

8. The apparatus of claim 6, wherein the support rod coupled to the cap is cylindrical in shape.

9. The apparatus of claim 6, wherein the filament is wound around the support rod.

10. The apparatus of claim 1, further comprising:
    a repeller plate disposed in a wall of the arc chamber facing the cathode.

11. The apparatus of claim 1, wherein the filament is formed to have a spiral shape.

12. The apparatus of claim 1, wherein the tapered sidewall is at an angle to the flat surface and the angle ranges from about 130° to 140°.

13. A method of generating ions using an apparatus, comprises:
    feeding a chemical into a receiving area of an arc chamber of the apparatus;
    feeding electrons generated by an electron source device into the receiving area from an electron source device, the electron source device comprises a cathode having a body and a cap disposed over the body, the cap having a receiving surface and an emitting surface opposite the receiving surface, the emitting surface having a convex shape facing the receiving area of the arc chamber, the receiving surface having a truncated conical shape where a center area is a flat surface and the center area being surrounded by a tapered sidewall; and a filament disposed in the body of the cathode; and
    ionizing the chemical to form a plasma comprising ions of the chemical in the receiving area.

14. The method of claim 13, wherein a diameter of the body is two to four times a diameter of the flat surface of the receiving surface.

15. The method of claim 13, wherein the cathode is made of material including tungsten.

16. The method of claim 13, wherein a distance between the tapered sidewall of the receiving surface to the emitting surface is substantially equal to a distance between the flat surface of the receiving surface to the emitting surface.

17. The method of claim 13, wherein the cathode further comprises a support rod disposed in a center of the body.

18. The method of claim 17, wherein the support rod of the cathode is configured to receive a voltage from a cathode power supply unit to generate an electric field.

19. The method of claim 17, wherein the support rod coupled to the cap is cylindrical in shape and a diameter of the support rod ranges from about 1.8 mm to 2.2 mm.

20. The method of claim 13, wherein the tapered sidewall is at an angle to the flat surface and the angle ranges from about 130° C. to 140° C.

\* \* \* \* \*